(12) United States Patent
Takagi

(10) Patent No.: US 6,790,321 B2
(45) Date of Patent: Sep. 14, 2004

(54) METHOD OF MANUFACTURING SURFACE ACOUSTIC WAVE DEVICE

(75) Inventor: Toshiyuki Takagi, Hokkaido (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/297,950

(22) PCT Filed: Jun. 7, 2001

(86) PCT No.: PCT/JP01/04814

§ 371 (c)(1),
(2), (4) Date: Dec. 26, 2002

(87) PCT Pub. No.: WO02/01714

PCT Pub. Date: Jan. 3, 2002

(65) Prior Publication Data

US 2003/0104136 A1 Jun. 5, 2003

(30) Foreign Application Priority Data

Jun. 26, 2000 (JP) ........................................ 2000-191732

(51) Int. Cl.[7] .......................... C23C 14/34; B05D 5/12; B05D 1/36
(52) U.S. Cl. .................. 204/192.12; 427/100; 427/404
(58) Field of Search ................................ 427/100, 404; 204/192.12

(56) References Cited

U.S. PATENT DOCUMENTS 5,815,900 A * 10/1998 Ichikawa et al. .......... 29/25.35

FOREIGN PATENT DOCUMENTS

JP          3-208888         9/1991      ........... C30B/23/08

* cited by examiner

*Primary Examiner*—Steven VerSteeg
(74) *Attorney, Agent, or Firm*—Oblon, Spivak, McClelland, Maier & Neustadt, P.C.

(57) ABSTRACT

A surface acoustic wave device used as a branching filter and the like in, for example, a mobile communications field to handle high frequencies of about several GHz is manufacturable by forming a metal film on a wafer-like piezoelectric substrate and selectively removing the metal film to form comb-teeth-shaped metal electrodes. The metal film is partly formed in two or more film-forming modes involving different in-wafer-plane film-forming-velocity distributions, and the remaining part thereof is formed in a fixed film-forming mode. An in-wafer-plane film-thickness distribution of a part of the metal film is precisely controllable. Forming the remaining part of the metal film precisely controls the final thickness of the metal film.

9 Claims, 6 Drawing Sheets

| FILM FORMING MODE | A | B | C | D | E | F |
|---|---|---|---|---|---|---|
| EROSION DIAMETER (STANDARDIZED VALUE) | 1.0 | 1.5 | 2.4 | 3.2 | 3.6 | 4.6 |

METHOD OF MANUFACTURING SURFACE ACOUSTIC WAVE DEVICE

TECHNICAL FIELD

The present invention relates to a manufacturing method of a surface acoustic wave device, and particularly, to a manufacturing method of a surface acoustic wave device serving as a branching filter and the like in, for example, a mobile communications field to handle high frequencies of about several GHz.

BACKGROUND ART

Surface acoustic wave devices (SAW devices) utilizing surface acoustic waves that concentrate their energy only at the surfaces of crystalline substrates involve propagation velocities slower than electromagnetic waves by about $10^{-5}$, and the devices can be downsized. Accordingly, they are recently applied to filters, oscillators, delay elements, and the like in broad fields including TVs, VTRs, and communications equipment. Among them, the mobile communications field, in particular, frequently uses mobile terminals, etc., employing the branching filters consisting of downsized surface acoustic wave devices.

The surface acoustic wave device has a piezoelectric substrate and two comb-teeth-shaped aluminum (Al) electrodes formed on the piezoelectric substrate and mating with each other. Surface acoustic waves propagating at the surface of the piezoelectric substrate are driven or detected by the Al electrodes. Conventionally, the surface acoustic wave device is manufactured by employing a magnetron sputtering method to form an Al film on a wafer-like piezoelectric substrate at a constant film-forming velocity and by employing a lithography technique and an etching technique to shape the Al film into comb-teeth patterns. Branching filters used for mobile terminals such as mobile telephones handle high frequencies of about several GHz, and therefore, the comb-teeth shapes of the Al electrodes must have high dimensional precision. In particular, the thickness and evenness of the comb-teeth-shaped Al electrodes must have a 0.1-nm-order accuracy.

DISCLOSURE OF THE INVENTION

The present invention is to solve the technical problems of the above-mentioned background technology, and an object of the present invention is to provide a manufacturing method of a surface acoustic wave device, capable of precisely controlling the thickness and in-wafer-plane evenness of a metal film.

To accomplish the object, the present invention is characterized to provide a manufacturing method of a surface acoustic wave device, including forming a metal film on a wafer-like piezoelectric substrate and selectively removing the metal film to form comb-teeth-shaped metal electrodes. To form the metal film on the piezoelectric substrate, the method forms a part of the metal film in two or more film-forming modes involving different in-wafer-plane film-forming-velocity distributions and forms the remaining part of the metal film in a fixed film-forming mode.

BEST MODE FOR CARRYING OUT THE INVENTION

Figure 1:
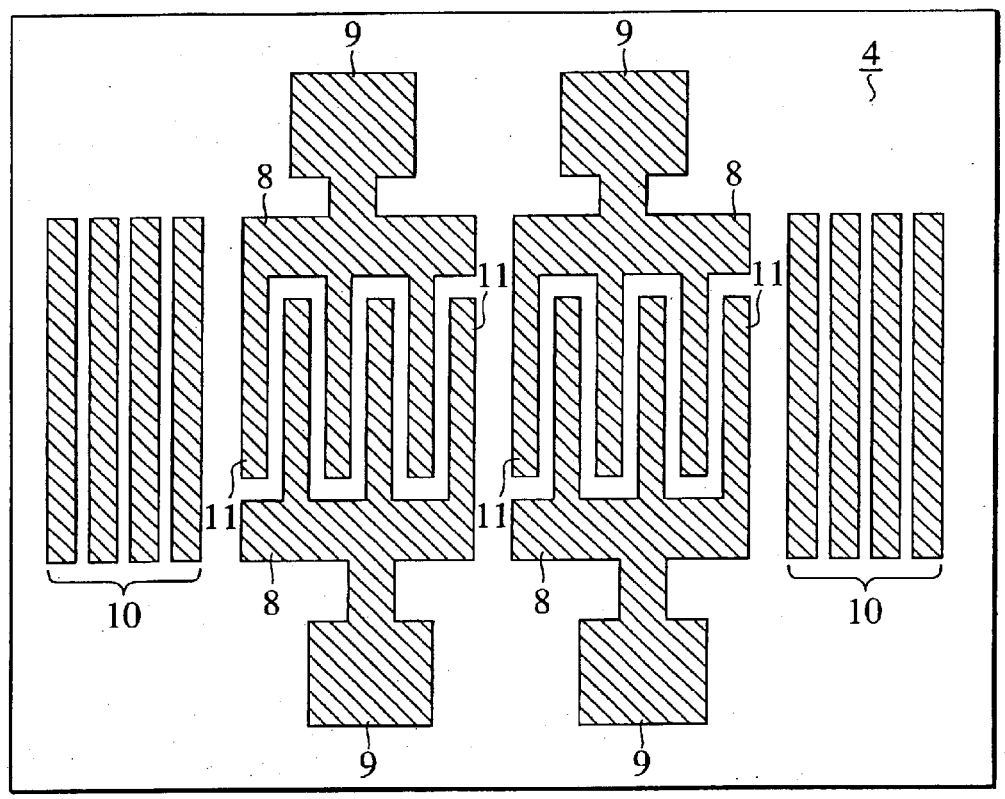
FIG. 1 is a plan view showing electrode patterns on a surface acoustic wave device according to an embodiment of the present invention.

With reference to the drawings, a best mode of implementation (hereinafter called "embodiment") of the present invention will be explained. In the drawings, the same or similar parts are represented with the same or similar marks. The drawings are typical and it must be noted that relationships between thicknesses and plan dimensions, thickness ratios among layers, etc., are different from actual ones. Accordingly, specific thicknesses and dimensions must be judged in consideration of the below-mentioned explanations. Naturally, dimensional relationships and ratios differ from one to another among the drawings.

A plurality of surface acoustic wave devices according to an embodiment are simultaneously formed on a wafer. As shown in FIG. 1, the surface acoustic wave device has a piezoelectric substrate 4 and a metal film having a predetermined shape arranged on the piezoelectric substrate 4. The metal film has two pairs of comb-teeth-shaped metal electrodes 8 mating with each other, electrode pads 9 connected to the metal electrodes 8, respectively, and reflectors 10 arranged on opposite ends of the metal electrodes 8. The metal electrodes 8 have electrode fingers 11 forming the mating comb-teeth parts. To the electrode pads 9, signal input/output terminals of the surface acoustic wave device are connectable. The reflectors 10 consist of a plurality of metals each having a rectangular plan shape with a large longitudinal-to-lateral ratio. The piezoelectric substrate 4 is a lithium tantalate (LiTaO₃) substrate. The metal film is made of 99.5 w/t % aluminum (Al) added with 0.5 w/t % copper (Cu).

Surface acoustic waves propagating at the surface of the piezoelectric substrate 4 are excited or detected by the electrode fingers 11 of the metal electrodes 8. Accordingly, the plan dimensions, i.e., longitudinal and lateral dimensions of the electrode fingers 11 and the dimension of a gap between the adjacent electrode fingers 11 are precisely controlled by a known patterning technique.

Figure 2:
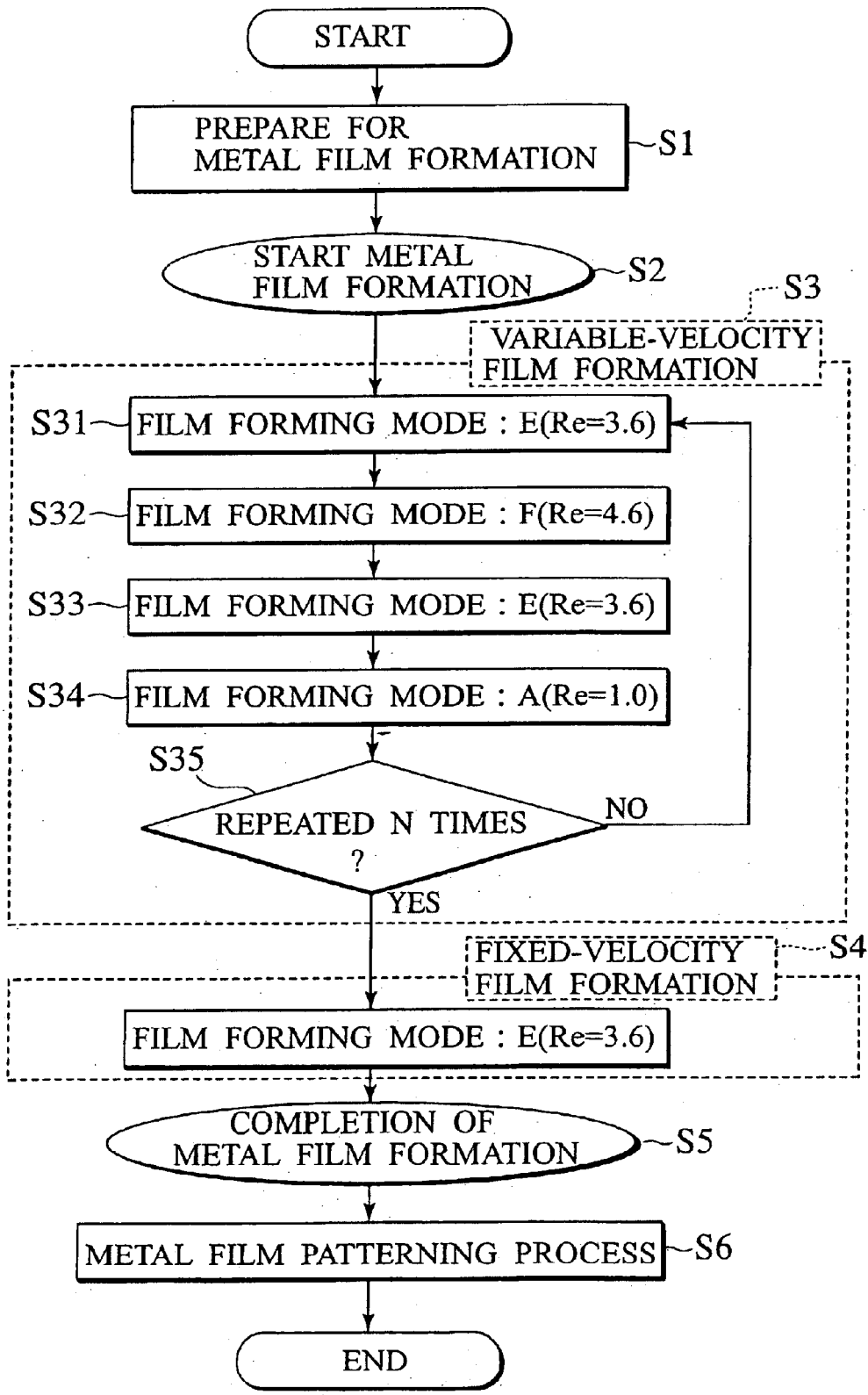
FIG. 2 is a flowchart showing a manufacturing method of a surface acoustic wave device according to an embodiment of the present invention.

With reference to FIG. 2, a manufacturing method of the surface acoustic wave device of FIG. 1 will be explained.

(A) In step S1, a wafer-like piezoelectric substrate 4 is set in a metal film forming apparatus, to prepare for forming a metal film on the piezoelectric substrate 4. According to an embodiment, the metal film forming apparatus is a magnetron-type sputtering apparatus that achieves a high-speed sputtering technique to generate a magnetic field in parallel with a target surface, promote ionization with the use of captured secondary electrons, and increase a deposition velocity.

The magnetron-type sputtering apparatus is an apparatus suitable for forming a metal film on a piezoelectric substrate having pyroelectricity. The magnetron-type sputtering apparatus has a target made of an alloy of 99.5 w/t % Al added with 0.5 w/t % Cu. Generating a magnetic field parallel to the surface of the target in the apparatus forms a circular erosion groove on the target surface. The erosion groove is a groove to be formed when the target sputters metal. Changing the diameter (hereinafter called "erosion diameter") of the erosion groove will change a metal-film-fanning velocity and an in-wafer-plane film-forming-velocity distribution. The erosion diameter changes in response to the strength of the electromagnetic field parallel to the target surface. Generally, if the erosion diameter is reduced (the magnetic field strength is increased), a film-forming velocity at a central part of a wafer becomes faster than that at a peripheral part of the wafer. If the erosion diameter is increased (the magnetic field strength is weakened), the film-forming velocity at the wafer central part becomes slower than that at the wafer peripheral part. As the erosion diameter is made smaller, a film-forming velocity over the wafer increases.

(B) In step S2, metal film formation starts. More precisely, a DC power source applies a voltage between a cathode electrode and an anode electrode arranged in the magnetron-type sputtering apparatus, to produce plasma, sputter target metal, and start depositing the sputtered metal on the piezoelectric substrate 4.

(C) In step S3 (variable-velocity film forming process), a part of the metal film is formed in two or more film-forming modes involving different in-wafer-plane film-forming-velocity distributions. "Forming a part of the metal film" means to form a part of a final metal film in the variable-velocity film forming process. The two or more film-forming modes involving different in-wafer-plane film-forming-velocity distributions used here are as follows:

<1> a film-forming mode (A-mode) in which a film-forming velocity Vc at a central part of the wafer 2 is faster than a film-forming velocity Vp at a peripheral part of the wafer 2;

<2> a film-forming mode (F-mode) in which the film-forming velocity Vc is slower than the film-forming velocity Vp; and <3> a third film-forming mode (E-mode) in which a film-forming-velocity difference v, obtained by subtracting the film-forming velocity Vp from the film-forming velocity Vc, is smaller than that of the A-mode and greater than that of the F-mode.

Each film-forming mode involves a different erosion diameter. When standardizing erosion diameters according to that of the A-mode, the F-mode has a standardized erosion diameter RE of 4.6 and the E-mode has RE of 3.6. In the variable-velocity film forming process, the three film-forming modes are cyclically repeated to form a part of the metal film.

More precisely, step S3 consists of steps S31 through S35. In step S31, a metal film is formed in the E-mode. In step S32, a metal film is formed in the F-mode. In step S33, a metal film is formed in the E-mode. In step S34, a metal film is formed in the A-mode. In step S35, it is determined whether or not a cycle of steps S31 to S34 has been repeated N times. If not repeated N times (NO in step S35), the flow returns to step S31 to repeat steps S31 through S34. Here, N is a natural number equal to or greater than 1. According to the embodiment and in the following explanation, N=7. If the cycle of steps S31 to S34 has been repeated seven times (YES in step S35), the flow advances to step S4.

(D) In step S4 (fixed-velocity film forming process), the remaining part of the metal film is formed in a fixed film-forming mode. "Forming the remaining part of the metal film" means to form, in the fixed-velocity film forming process, the remaining part of the final metal film excluding the part formed in the variable-velocity film forming process. The fixed film-forming mode to form the remaining part of the metal film is the E-mode. As explained above, in the E-mode, the film-forming-velocity difference v obtained by subtracting the film-forming velocity Vp from the film-forming velocity Vc is smaller than that of the A-mode and greater than that of the F-mode. Namely, the E-mode is a film-forming mode in which the absolute value (|v|) of a film-forming-velocity difference between velocities at central and peripheral parts of a wafer is smaller than those of the A-mode and F-mode.

(E) In step S5 after the completion of step S4, the magnetron-type sputtering apparatus is turned off to complete the metal film formation. Steps S1 through S5 mentioned above form, on the wafer 2, a metal film having a multilayer structure due to the film-forming modes.

(F) Lastly, the multilayer metal film fonned on the piezoelectric substrate 4 is patterned in a metal film patterning process by a predetermined lithography technique and etching technique to form the metal electrodes 8 having required plan shapes as shown in FIG. 1B. Through steps S1 to S6 mentioned above, the surface acoustic wave device 1 shown in FIGS. 1A and 1B is manufactured.

Figure 3:
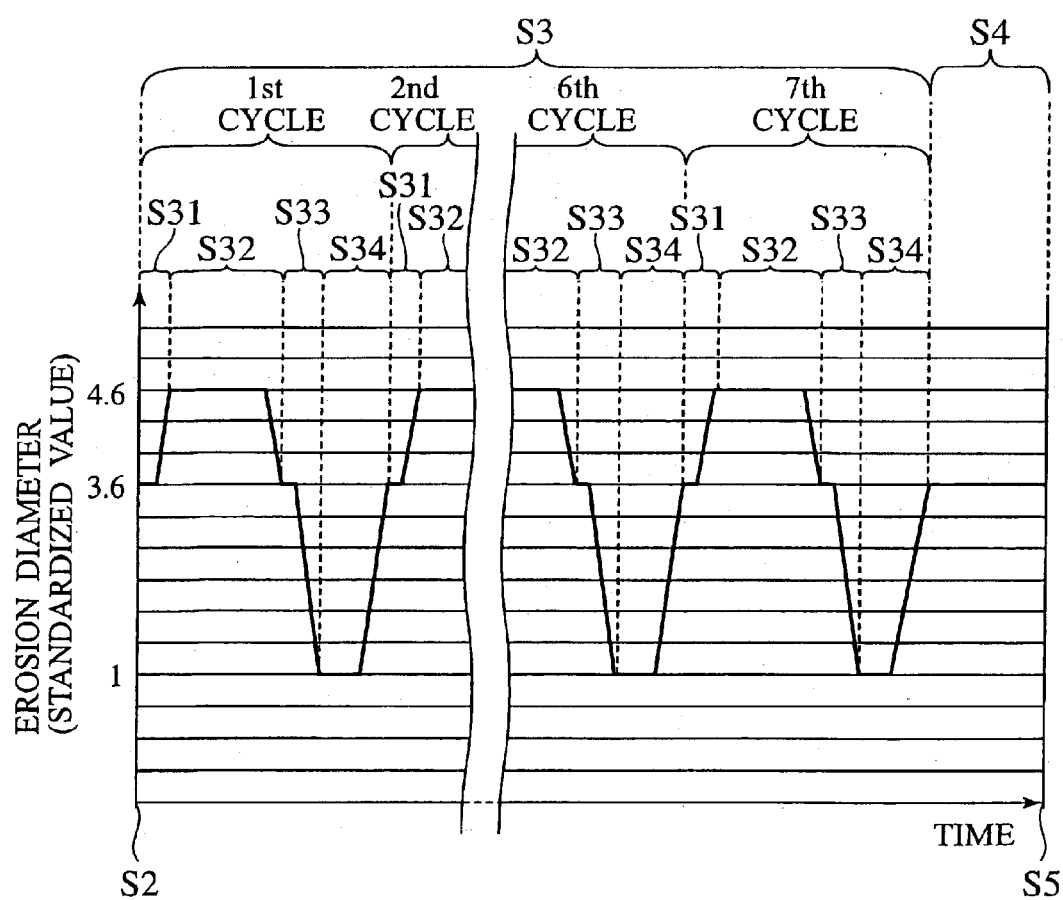
FIG. 3 is a view showing an example of a film forming method in a metal film forming process shown in FIG. 2.

Next, with reference to FIG. 3, the variable-velocity film forming process (S3) and fixed-velocity film forming process (S4) will be explained in detail in terms of the erosion diameter. In a graph shown in FIG. 3, an ordinate represents the erosion diameter (with standardized values) and an abscissa represents elapsed time. Values of the erosion diameter are standardized with the erosion diameter of the A-mode serving as 1. As explained above, the erosion diameter is adjustable according to the strength of a magnetic field parallel to a target surface.

After starting the metal film formation (S2), the erosion diameter (RE) is set to 3.6 in the E-mode (S31). Continuously thereafter, the erosion diameter (RE) is set to 4.6 in the F-mode (S32). In the E-mode (S33), the erosion diameter (RE) is set to 3.6. In the A-mode (S34), the erosion diameter (RE) is set to 1.0. These temporal erosion diameter changes form a cycle and are repeated seven times. After the completion of seven cycles, the erosion diameter (RE) is set to 3.6 in the E-mode (S4). In this way, the erosion diameter (RE) is cyclically changed, to achieve the variable-velocity film forming process (S3) and fixed-velocity film forming process (S4) shown in FIG. 3.

Figure 4:
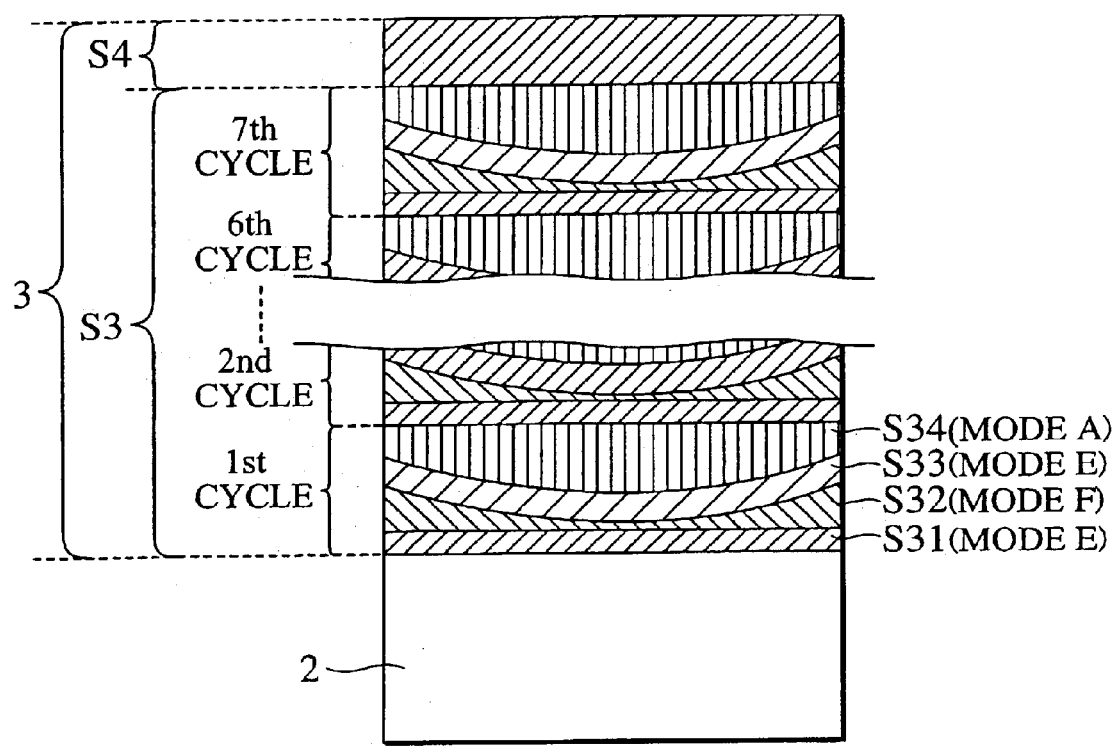
FIG. 4 is a sectional view showing a metal film formed on a piezoelectric substrate (wafer) according to the film forming method of FIG. 3.

Next, with reference to FIG. 4, a sectional structure of the metal film formed through the variable-velocity film forming process (S3) and fixed-velocity film forming process (S4) will be explained. FIG. 4 shows a structure of the metal film 3 before carrying out the patterning process of step S6. To clearly show a metal film thickness difference between a central part and a peripheral part on the wafer, aspect ratios of the wafer 2 and metal film 3 shown in FIG. 4 greatly differ from actual ones. As shown in FIG. 4, the metal film 3 consists of a film formed by the variable-velocity film forming process (S3) and a film formed by the fixed-velocity film forming process (S4). On the wafer 2, the film by the variable-velocity film forming process (S3) is formed, and thereon, the film by the fixed-velocity film forming process (S4) is formed. The film by the variable-velocity film forming process (S3) consists of a plurality of films formed in the first through seventh cycles, respectively. The film of each cycle further consists of a plurality of films formed in steps S31 through S34, respectively.

The film formed in step S31 in the E-mode (hereinafter called the "S31(E-mode)film") involves substantially no film thickness difference between the central and peripheral parts of the wafer 2. In the S32(F-mode) film, a film thickness at the central part of the wafer 2 is thinner than a film thickness at the peripheral part thereof. The S33(E- mode) film is like the S31(E-mode) film. In the S34(A-mode) film, a film thickness at the central part of the wafer 2 is thicker than a film thickness at the peripheral part thereof. In this way, the films formed in the respective film-forming modes have different in-wafer-plane film-thickness distributions.

The first-cycle (S31 through S34) film has substantially no film thickness difference between the central and peripheral parts of the wafer 2 and shows an even in-wafer-plane film-thickness distribution. The second-to seventh-cycle films are like the firs-cycle film. Namely, combining two or more film-forming modes (A-mode and F-mode) involving uneven in-wafer-plane film-thickness distributions and a film-forming mode (E-mode) involving an even in-wafer-plane film-thickness distribution equalizes the in-wafer-plane film-thickness distribution of a metal film formed in one cycle. The film-forming modes (A-mode and F-mode) have opposite film-thickness distributions. Namely, as explained above, the A-mode has a film-forming velocity Vc at the central part of the wafer 2 faster than a film-forming velocity Vp at the peripheral of the wafer 2, and the F-mode shows the film-forming velocity Vc slower than the film-forming velocity Vp.

The case explained here forms a cycle from three film-forming modes, i.e.; the A-mode, F-mode, and E-mode. It is possible to exclude, from a cycle, the film-forming mode (E-mode) showing an even in-wafer-plane film-thickness distribution and form a cycle with two or more film-forming modes (A-mode and F-mode) showing uneven in-wafer-plane film-thickness distributions. In this case, adjusting a film forming time of each mode will equalize the in-wafer-plane film-thickness distribution of a metal film formed in each cycle.

For example, the thickness of the metal film 3 to be formed is 185 nm and each cycle forms a film of 25 nm thick. In this case, the above-mentioned cycle is repeated seven times. As a result, a film of 25×7=175 nm thick is formed with an even film-thickness distribution. Then, the remaining film of 10 nm thick is formed in the fixed-velocity film forming process (S4), to provide metal electrodes having a total film thickness of 25×7+10=185 nm. In this way, the variable-velocity film forming process (S3) capable of forming a metal film having an even in-wafer-plane film-thickness distribution is employed to form the metal film 3 up to nearly the required film thickness, and the fixed-velocity film forming process (S4) is employed to carry out a final fine film thickness adjustment on the metal film 3.

To equalize the in-wafer-plane film-thickness distribution of a metal film formed on a wafer in each cycle, a film forming time of each of the film-forming modes (A-mode, F-mode, and E-mode) constituting the cycle must be adjusted. Namely, it is necessary to grasp, in advance, how the in-wafer-plane film-forming-velocity distribution of each film-forming mode is. In addition, a film-forming mode used in the fixed-velocity film forming process (S4) to carry out a final fine adjustment on the thickness of the metal film 3 is preferably required to have a sufficiently low film-forming velocity. Accordingly, the inventor measured the in-wafer-plane film-forming-velocity distribution of each film-forming mode.

The measurement was carried out on a plurality of film-forming modes having different erosion diameters. In each film-forming mode, a metal film (Al film) was formed on a standard sample for a given time, and the thickness thereof was measured. Erosion diameters were controlled with current values applied to an electromagnet for sputtering spat-tering. A measuring apparatus used was profilometer (maker: KLA Tencor, model: P-10). The profilometer scans a wafer with a probe to measure irregularities on the surface of the wafer. The probe moves up and down in response to irregularities on the surface, to change the value of a capacitance attached to a base of the probe. The capacitance value change is read as an electric signal, to measure the irregularities on the surface. The same location on the wafer was measured 10 times and an average thereof was calculated.

Figures 5, 6:
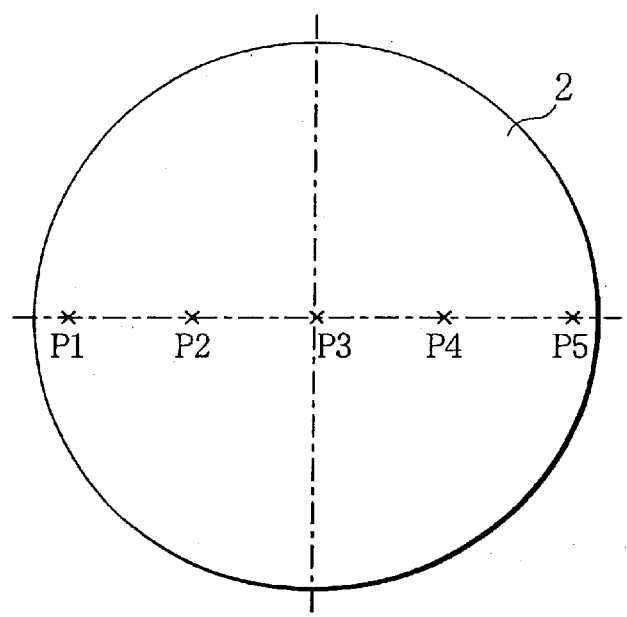
FIGS. 5 to 7 show film-thickness distributions of metal films formed in different film-forming conditions.

As shown in FIG. 5, film thickness measuring locations are five including a central part P3 of a wafer 2 having a radius of 50 mm, peripheral parts (P1 and P5) 40 mm from the central part, and intermediate parts (P2 and P4) 20 mm from the central part. As shown in FIG. 6, film-thickness distributions were measured for six film-forming modes A through F. Erosion diameters (standardized values) of the film-forming modes are as shown in FIG. 6. Each erosion diameter value is a standardized value with a value of the A-mode serving as 1.

Figure 7:
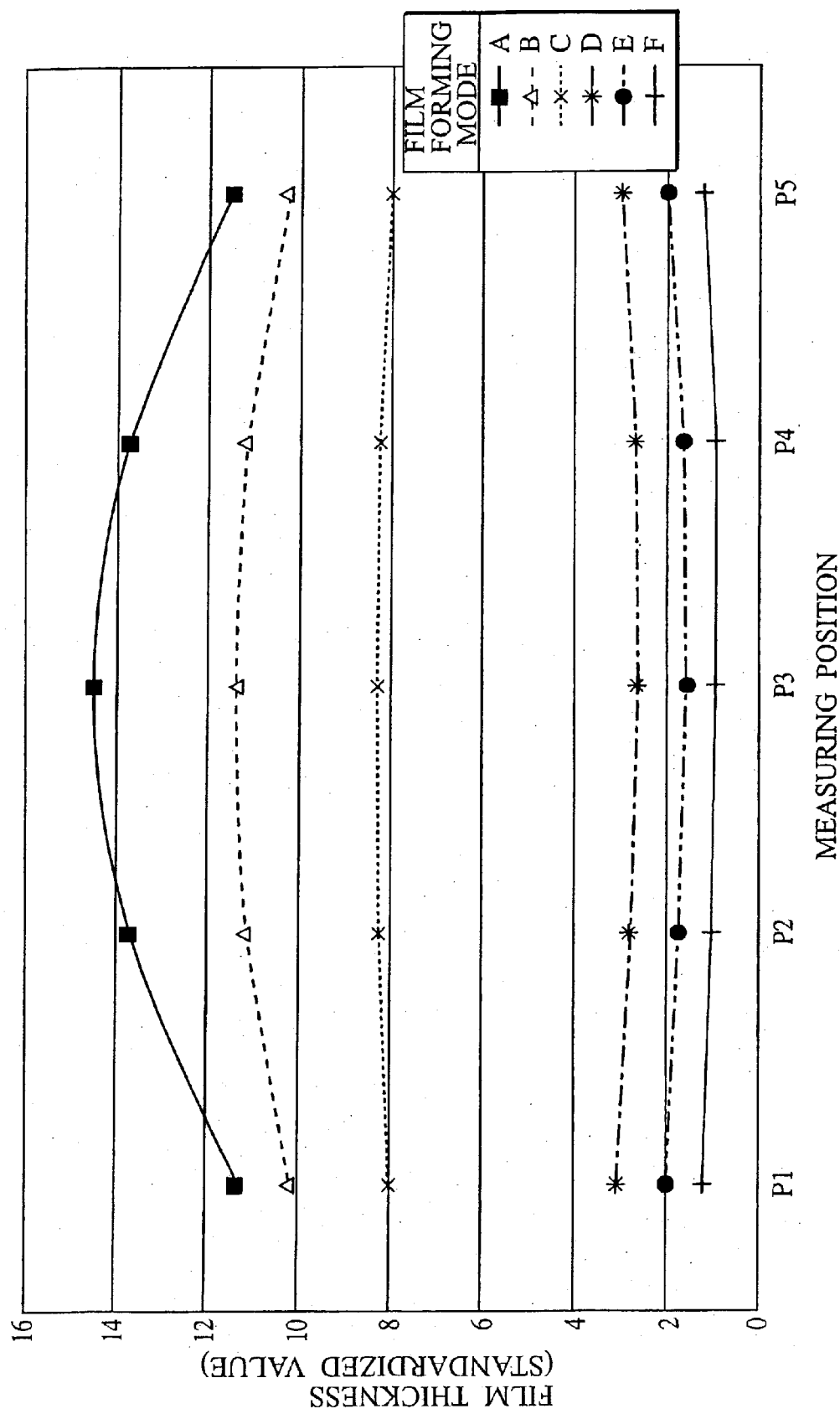

As shown in FIG. 7, a film-thickness distribution in the A-mode having the smallest erosion diameter shows a thicker film thickness at the wafer central part than at the peripheral parts and a largest film thickness difference compared with the other film-forming modes. A film-forming velocity over the wafer in the A-mode is fastest among all modes. As the erosion diameter increases, a film thickness difference between the central and peripheral parts of a wafer becomes smaller and the film-forming velocity over the wafer becomes slower. A film-thickness distribution of the F-mode having the largest erosion diameter shows that a film thickness at the wafer central part is thinner than those at the peripheral parts and a film-forming velocity over the wafer is slowest among all modes. The film thickness values are standardized according to a film thickness value at the coordinates of the location P3 formed in the F-mode.

To carry out a final fine adjustment on the film thickness of the metal film 3, a film-forming velocity of the film-forming mode used in the fixed-velocity film forming process (S4) must be equal to or lower than 150 nm per minute, and preferably, equal to or lower than 100 nm per minute. This film-forming velocity is an average of film-forming velocities at the wafer central part (P3) and peripheral parts (P1 and P5). An in-wafer-plane film-thickness distribution (|W|) in the fixed-velocity film forming process (S4) is preferably equal to or lower than 12%, and more preferably, equal to or lower than 11%. The in-wafer-plane film-thickness distribution W is defined as $W=(Tc-Tp)/(Tc+Tp)$ where Tc is a film thickness at the wafer central part P3 and Tp is a film thickness at the wafer peripheral part (P1 or P5). Film-forming modes that satisfy the above-mentioned film-forming conditions in the fixed-velocity film forming process are the D-mode, E-mode, and F-mode. Among them, the embodiment has selected the E-mode. Accordingly, instead of the E-mode, the D-mode or the F-mode may be employed in the fixed-velocity film forming process.

A film forming time ratio of the film-forming modes (A, E, and F) constituting a cycle in the variable-velocity film forming process can be set according to the measurement results shown in FIG. 7. More precisely, to cancel a film-thickness distribution WA of the A-mode with a film-thickness distribution WF of the F-mode, i.e., to satisfy WA+WF=0, a film forming time of the A-mode is set longer than that of the F-mode, thereby equalizing a film-thickness distribution in each cycle.

As explained above, forming a part of the metal film 3 in two or more film-forming modes (A-mode, E-mode, and F-mode) having different in-wafer-plane film-thickness distributions (variable-velocity film forming process) is capable of precisely controlling the in-wafer-plane film-thickness distribution of the part of the metal film 3. Forming the remaining part of the metal film 3 under a fixed film-forming condition (E-mode) is capable of precisely controlling the final thickness of the metal film 3.

Other Embodiments

In the above, the present invention has been described with reference to one embodiment. The description and drawings forming part of this disclosure must not be understood that they limit the present invention. Based on this disclosure, a person skilled in the art may clarify various alternative forms, embodiments, and application techniques.

The materials and properties of the parts such as the piezoelectric substrate 4 mentioned in the embodiment are only examples and they are replaceable to provide the same effect of the present invention. For example, according to the embodiment, the material of the piezoelectric substrate 4 is lithium tantalate ($LiTaO_3$). However, the substrate may be a lithium niobate ($LiNbO_3$) substrate, a lithium barate ($LiB_4O_7$) substrate, or a piezoelectric substrate made of other material such as sapphire and crystal. The embodiment has been explained in connection with a metal film made of an alloy of 99.5 w/t % Al and 0.5 w/t % Cu. Also possible is an electrode film made of Al without additives, or with an additive of other metal, or with a composition ratio different from the above-mentioned values.

According to the embodiment, a metal film is directly formed on a piezoelectric substrate 4. It is possible to form, between the piezoelectric substrate 4 and the metal film, a barrier metal film made of, for example, titanium (Ti) or tantalum (Ta).

Further, according to the embodiment, the variable-velocity film forming process is cyclically carried out, and then, the fixed-velocity film forming process is carried out. Instead, the fixed-velocity film forming process may be carried out first, and then, the variable-velocity film forming process may be carried out. In the variable-velocity film forming process, film-forming velocities were changed in order of the E-mode, F-mode, E-mode, and A-mode. The order may not be limited to this and may be changed. Instead of the A-, E-, and F-modes, other film-forming modes shown in FIG. 6 are employable.

Also, according to the embodiment, an erosion diameter is determined by adjusting the strength of a magnetic field in a sputtering apparatus. Instead of adjusting the magnetic field strength, an erosion diameter may be determined by adjusting sputtering power of a magnetron-type sputtering apparatus.

In this way, it must be understood that the present invention covers various embodiments not mentioned here. Accordingly, the present invention is limited only by invention-defining particulars that are pertinent to this disclosure and -are specified in the claims.

What is claimed is:

1. A manufacturing method of a surface acoustic wave device including forming a metal film on a piezoelectric substrate and selectively removing the metal film to form comb-teeth-shaped metal electrodes, the process of forming the metal film on the piezoelectric substrate comprising:
    a first process of forming films by cyclically repeating two or more film-forming modes involving different in-wafer-plane film-forming-velocity distributions; and
    a second process of forming a film in a fixed film-forming mode.

2. The manufacturing method of a surface acoustic wave device of claim 1, wherein the two or more film-forming modes involving different in-wafer-plane film-forming-velocity distributions include:
    a first film-forming mode in which a film-forming velocity at a central part of the wafer is faster than that at a peripheral part of the wafer; and
    a second film-forming mode in which a film-forming velocity at the central part of the wafer is slower than that at the peripheral part of the wafer.

3. The manufacturing method of a surface acoustic wave device of claim 2, wherein the fixed film-forming mode in the second process is a film-forming mode in which a film-forming-velocity difference v, obtained by subtracting a film-forming velocity at the peripheral part of the wafer from a film-forming velocity at the central part of the wafer, is smaller than that of the first film-forming mode and greater than that of the second film-forming mode.

4. A manufacturing method of a surface acoustic wave device including forming a metal film on a piezoelectric substrate and selectively removing the metal film to form comb-teeth-shaped metal electrodes, the process of forming the metal film on the piezoelectric substrate comprising:
    a first process of forming films in two or more film-forming modes involving different in-wafer-plane film-forming-velocity distributions; and
    a second process of forming a film in a film-forming mode at an average film-forming velocity of 150 nm/min or slower.

5. The manufacturing method of a surface acoustic wave device of claim 4, wherein the two or more film-forming modes involving different in-wafer-plane film-forming-velocity distributions include:
    a first film-forming mode in which a film-forming velocity at a central part of the wafer is faster than that at a peripheral part of the wafer; and
    a second film-forming mode in which a film-forming velocity at the central part of the wafer is slower than that at the peripheral part of the wafer.

6. The manufacturing method of a surface acoustic wave device of claim 5, wherein the film-forming mode in the second process is a film-forming mode in which a film-forming-velocity difference v, obtained by subtracting a film-forming velocity at the peripheral part of the wafer from a film-forming velocity at the central part of the wafer, is smaller than that of the first film-forming mode and greater than that of the second film-forming mode.

7. A manufacturing method of a surface acoustic wave device including forming a metal film on a piezoelectric substrate by a magnetron sputtering technique and selectively removing the metal film to form comb-teeth-shaped metal electrodes, the process of forming the metal film on the piezoelectric substrate comprising:
    a first process of forming films by cyclically changing erosion diameters on a target; and
    a second process of forming a film at a fixed erosion diameter.

8. The manufacturing method of a surface acoustic wave device of claim 7, wherein the erosion diameters cyclically changed in the first process include:
    a first erosion diameter with which a film-forming velocity at a central part of the wafer is faster than that at a peripheral part of the wafer; and
    a second erosion diameter with which a film-forming velocity at the central part of the wafer is slower than that at the peripheral part of the wafer.

9. The manufacturing method of a surface acoustic wave device of claim 8, wherein the fixed erosion diameter in the second process is longer than the first erosion diameter and shorter than the second erosion diameter.

* * * * *